US012804880B2

(12) United States Patent
Tung et al.

(10) Patent No.: US 12,804,880 B2
(45) Date of Patent: Nov. 17, 2026

(54) SEMICONDUCTOR DEVICE AND METHOD OF FABRICATING THE SAME

(71) Applicant: Fujian Jinhua Integrated Circuit Co., Ltd., Quanzhou City (CN)

(72) Inventors: Yu-Cheng Tung, Quanzhou City (CN); Janbo Zhang, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 555 days.

(21) Appl. No.: 18/198,297

(22) Filed: May 17, 2023

(65) Prior Publication Data

US 2023/0422481 A1 Dec. 28, 2023

(30) Foreign Application Priority Data

Jun. 22, 2022 (CN) ........................ 202210716437.X
Jun. 22, 2022 (CN) ........................ 202221599988.4

(51) Int. Cl.
*H10B 12/00* (2023.01)
*H10D 1/00* (2025.01)
*H10D 1/68* (2025.01)

(52) U.S. Cl.
CPC ......... *H10B 12/315* (2023.02); *H10B 12/033* (2023.02); *H10D 1/042* (2025.01); *H10D 1/714* (2025.01)

(58) Field of Classification Search
CPC .... H10B 12/315; H10B 12/033; H10D 1/042; H10D 1/714
See application file for complete search history.

(56) References Cited

U.S. PATENT DOCUMENTS 9,153,499 B2 10/2015 Kim et al.
9,287,270 B2 3/2016 Oh et al.
9,853,032 B2 12/2017 Seo
10,483,265 B2 11/2019 Lee et al.
(Continued)

FOREIGN PATENT DOCUMENTS

CN 107799523 9/2021

OTHER PUBLICATIONS

Wu, the specification, including the claims, and drawings in the U.S. Appl. No. 18/122,096, filed Mar. 15, 2023.

*Primary Examiner* — Richard A Booth
(74) *Attorney, Agent, or Firm* — Winston Hsu

(57) ABSTRACT

The present disclosure provides a semiconductor device and a method of fabricating the same, the semiconductor device includes a substrate, a plurality of storage node pads, a supporting structure, and a capacitor structure. The storage node pads are disposed on the substrate. The supporting structure is disposed on the substrate and includes a first supporting layer and a second supporting layer from bottom to top. The capacitor structure is disposed on the substrate, and the capacitor structure includes columnar bottom electrodes, a capacitor dielectric layer and a top electrode layer stacked from bottom to top, wherein the columnar bottom electrodes include a first columnar bottom electrode having a symmetric columnar structure and a second columnar bottom electrode having an asymmetric columnar structure, and the first columnar bottom electrode and the second columnar bottom electrode respectively include at least one horizontal extending portion along a horizontal direction.

9 Claims, 16 Drawing Sheets

(56) References Cited

U.S. PATENT DOCUMENTS

| | | | | |
|---|---|---|---|---|
| 10,714,565 | B2 | 7/2020 | Nam et al. | |
| 10,943,908 | B2 | 3/2021 | Bae et al. | |
| 10,998,318 | B2 | 5/2021 | Choo et al. | |
| 11,056,355 | B2 | 7/2021 | Choi et al. | |
| 12,419,062 | B2 * | 9/2025 | Lin | H10D 1/696 |
| 2012/0064689 | A1 | 3/2012 | Hirota et al. | |
| 2015/0270330 | A1 | 9/2015 | Lee et al. | |
| 2020/0144269 | A1 | 5/2020 | Kim et al. | |
| 2020/0219886 | A1 | 7/2020 | Sills | |
| 2021/0151439 | A1 | 5/2021 | Choi | |
| 2021/0202490 | A1 * | 7/2021 | Cho | H10D 1/716 |
| 2024/0090201 | A1 * | 3/2024 | Chou | H10B 12/0335 |
| 2024/0234486 | A1 * | 7/2024 | Tung | H10D 1/042 |

* cited by examiner

SEMICONDUCTOR DEVICE AND METHOD OF FABRICATING THE SAME

BACKGROUND OF THE INVENTION

1. Field of the Invention

The present disclosure relates to a semiconductor device and the method for fabricating the same, and more particular to a semiconductor memory device and a method for fabricating the same.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM having planar gate structures under the current mainstream development trend.

Generally, the DRAM having recessed gate structure is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to fulfill the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

One of the objectives of the present disclosure provides a method of fabricating a semiconductor device, in which a sacrificial layer are previously formed on sidewalls of each bottom electrode layer, so that each bottom electrode layer may have a vertical columnar structure with a narrow top and a wide bottom after removing the sacrificial layer. Then, a distance between each bottom electrode layer may therefore be enlarged, which is beneficial on performing the subsequent deposition process of a capacitor dielectric layer and a top electrode layer.

One of the objectives of the present disclosure provides a semiconductor device, where the bottom electrode layers include a first bottom electrode layer with a symmetric columnar structure and a second bottom electrode layer with an asymmetric columnar structure, and the first bottom electrode layer and the second bottom electrode layer respectively include at least one horizontal extending portion along a horizontal direction, to disposed over the capacitor dielectric layer, thereby obtaining a more reliable capacitor structure. Then, the capacitor structure is further stably supported by the supporting structure, and the semiconductor device may gain optimized functions and performance thereby.

To achieve the purpose described above, one embodiment of the present disclosure provides a semiconductor device including a substrate, a plurality of storage node pads, a supporting structure, and a capacitor structure. The storage node pads are disposed on the substrate. The supporting structure is disposed on the substrate and includes a first supporting layer and a second supporting layer from bottom to top. The capacitor structure is disposed on the substrate, and the capacitor structure includes a plurality of columnar bottom electrodes, a capacitor dielectric layer and a top electrode layer stacked from bottom to top, wherein the columnar bottom electrodes include a first columnar bottom electrode having a symmetric columnar structure and a second columnar bottom electrode having an asymmetric columnar structure, and the first columnar bottom electrode and the second columnar bottom electrode respectively include at least one horizontal extending portion along a horizontal direction.

To achieve the purpose described above, one embodiment of the present disclosure provides a method of fabricating a semiconductor device including the following steps. Firstly, a substrate is provided, and a plurality of storage node pads is formed on the substrate. Next, a supporting structure is formed on the substrate, with the supporting structure including a first supporting layer and a second supporting layer from bottom to top. Then, a capacitor structure is formed on the substrate, and the capacitor structure includes a plurality of columnar bottom electrodes, a capacitor dielectric layer and a top electrode layer stacked from bottom to top, wherein the columnar bottom electrodes include a first bottom electrode layer having a symmetric columnar structure and a second columnar bottom electrode having a asymmetric columnar structure, and the first columnar bottom electrode and the second columnar bottom electrode respectively includes at least one horizontal extending portion along a horizontal direction.

To achieve the purpose described above, one embodiment of the present disclosure provides a semiconductor device including a substrate, a plurality of storage node pads, a supporting structure, and a capacitor structure. The storage node pads are disposed on the substrate. The supporting structure is disposed on the substrate and includes a first supporting layer and a second supporting layer from bottom to top. The capacitor structure is disposed on the substrate, and the capacitor structure includes a plurality of columnar bottom electrodes, a capacitor dielectric layer and a top electrode layer stacked from bottom to top, wherein each of the columnar bottom electrodes include two recess portions extended from second supporting layer to first supporting layer, and the two recess portions are asymmetric to each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing.

Identical or similar features in different embodiments are marked with identical symbols.

FIG. 1 to FIG. 9 are schematic diagrams illustrating a fabricating method of a semiconductor device according to a first embodiment in the present disclosure, wherein:

FIG. 1 shows a schematic cross-sectional view of a semiconductor device after forming a supporting layer structure;

FIG. 2 shows a schematic cross-sectional view of a semiconductor device after forming a sacrificial material layer;

FIG. 3 shows a schematic cross-sectional view of a semiconductor device after forming a sacrificial layer;

FIG. 4 shows a schematic cross-sectional view of a semiconductor device after forming columnar bottom electrodes;

FIG. 5 shows a schematic cross-sectional view of a semiconductor device after forming a mask layer;

FIG. 6 shows a schematic cross-sectional view of a semiconductor device after removing a third supporting material layer;

FIG. 7 shows a schematic cross-sectional view of a semiconductor device after removing the sacrificial layer;

FIG. 8 shows a schematic cross-sectional view of a semiconductor device after removing a first supporting material layer; and FIG. 9 shows a schematic cross-sectional view of a semiconductor device after forming a capacitor structure and a supporting structure.

FIG. 10 to FIG. 12 are schematic diagrams illustrating a fabricating method of a semiconductor device according to a second embodiment in the present disclosure, wherein:

FIG. 10 shows a schematic cross-sectional view of a semiconductor device after forming columnar bottom electrodes;

FIG. 11 shows a schematic cross-sectional view of a semiconductor device after forming a capacitor structure and a supporting structure; and FIG. 12 shows another schematic cross-sectional view of another semiconductor device after forming a capacitor structure and a supporting structure.

FIG. 13 to FIG. 16 are schematic diagrams illustrating a fabricating method of a semiconductor device according to a third embodiment in the present disclosure, wherein:

FIG. 13 shows a schematic cross-sectional view of a semiconductor device after forming a sacrificial layer;

FIG. 14 shows a schematic cross-sectional view of a semiconductor device after forming columnar bottom electrodes;

FIG. 15 shows a schematic cross-sectional view of a semiconductor device after forming a capacitor structure and a supporting structure; and FIG. 16 shows another schematic cross-sectional view of a semiconductor device after forming a capacitor structure and a supporting structure.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
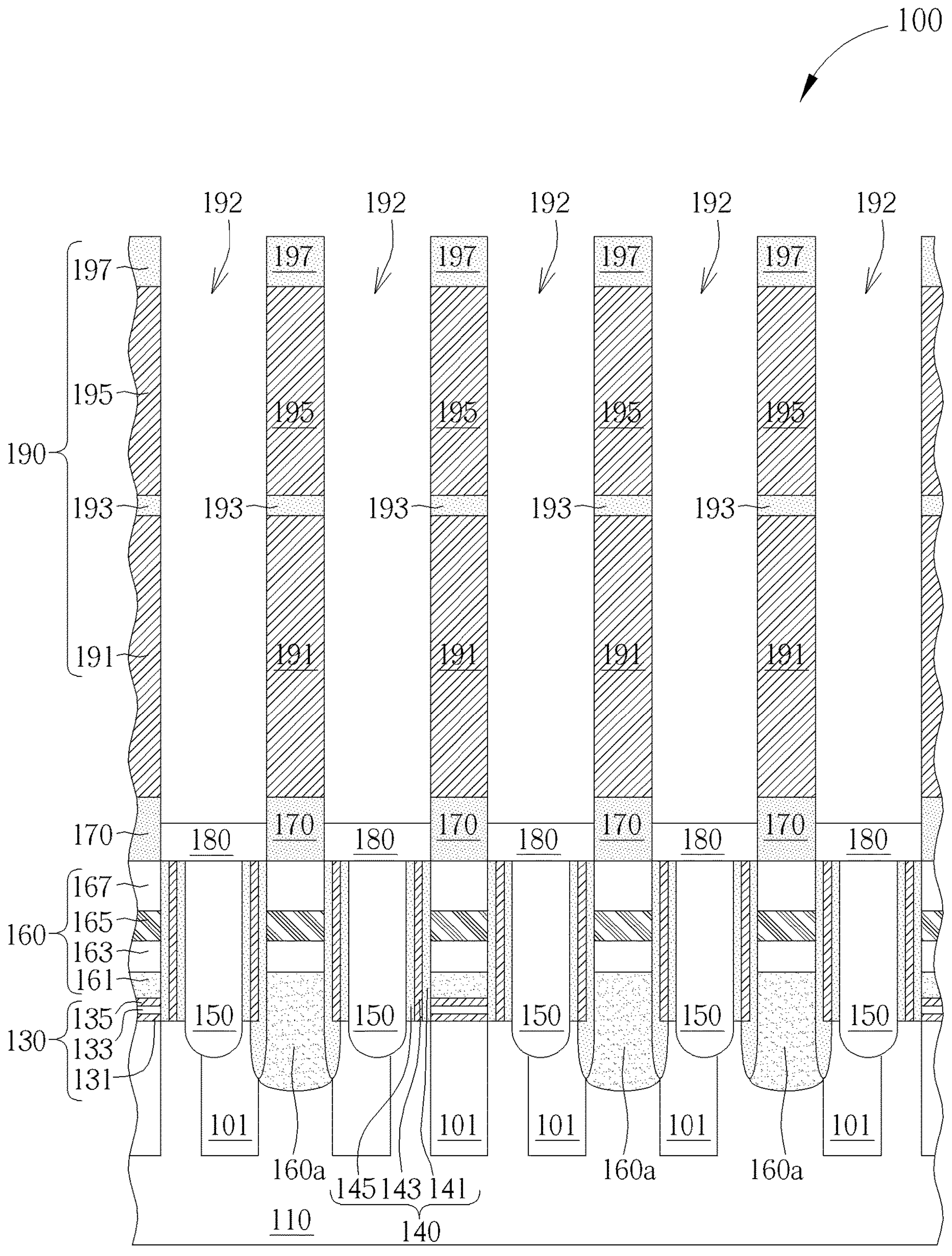

Please refer to FIG. 1 to FIG. 9, which illustrate schematic diagrams of a fabricating method of a semiconductor device 100 according to the first embodiment in the present disclosure. Firstly, as shown in FIG. 1, a substrate 110 is provided, such as a silicon substrate, a silicon-containing substrate (for example including a material like SiC, SiGe), or a silicon-on-insulator (SOI) substrate, and at least one isolating region such as a shallow trench isolation (STI) 101 is formed in the substrate 110, to define a plurality of active areas (AAs, not shown in the drawings) in the substrate 110. Then, the shallow trench isolation 101 may therefore surround all of the active areas. In one embodiment, the formation of the shallow trench isolation 101 is accomplished by carrying out an etching process to form a plurality of trenches (not shown in the drawings) in the substrate 110, and an isolating material (for example silicon oxide or silicon oxynitride) is filled in the trenches, but not limited thereto.

Also, a plurality of buried gate structures (not shown in the drawings) is formed in the substrate 110, with each of the buried gate structures being parallel extended along a direction (for example the x-direction, not shown in the drawings) to intersect the active areas and the shallow trench isolation 101, and the buried gate structures may therefore serve as buried word lines (BWLs, not shown in the drawings) of the semiconductor device 100. Then, a plurality of bit lines 160 and a plurality of plugs 150 are formed on the substrate 110, with each of the bit lines 160 being extended along another direction (for example the y-direction, not shown in the drawings) which is perpendicular to the direction, to alternately arrange with the plugs 150. It is noted that although the entire extending directions of the active areas, the buried gate structures and the bit lines 160 are not precisely illustrated in the drawings of the present embodiment, people in the art should fully realizes the bit lines 160 are perpendicular to the buried gate structures, to intersect the active areas and the buried gate structures at the same time, as being viewed from a top view (not shown in the drawings).

Precisely speaking, each of the bit lines 160 is separately formed on the substrate 110 and includes a semiconductor layer 161 (for example including polysilicon), a barrier layer 163 (for example including titanium and/or titanium nitride), a conductive layer 165 (for example including a low-resistant metal like tungsten, aluminum, or copper), and a capping layer 167 (for example including silicon oxide, silicon nitride, or silicon oxynitride, but not limited thereto. It is noted that, all of the bit lines 160 are principally parallel with each other and formed on a dielectric layer 130 over the substrate 110, wherein the dielectric layer 130 preferably includes a composited structure for example having a silicon oxide layer 131-silicon nitride layer 133-silicon oxide layer 135 (ONO) structure, but is not limited thereto. Moreover, the bit lines 160 are all extended across couple of the active areas, with each of the bit lines 160 further extending into each of the active areas through a corresponding bit line contact (BLC) 160*a* under the bit lines 160. It is also noted that, the bit line contact 160*a* and the semiconductor layer 161 of the bit lines 160 are monolithic, and the bit line contact 160*a* may directly contact the substrate 110 (namely, each of the active areas) underneath.

On the other hand, each of the plugs 150 are separately formed on the substrate 110, to further extend into each of the active areas, so that, each of the plugs 150 may therefore serves as a storage node contact (SNC) of the semiconductor device 100, to directly contact the substrate 110 (including the active areas and the shallow trench isolation 101) underneath. In one embodiment, the plugs 150 for example include a low resistant metal material like aluminum (Al), titanium (Ti), copper (Cu), or tungsten (W), and each of the plugs 150 and each of the bit lines 160 are isolated from each other by a spacer structure 140. In one embodiment, the spacer structure 140 may optionally include a monolayer structure or a multilayer structure as shown in FIG. 1, and the multilayer structure for example includes a first spacer 141 (for example including silicon nitride), a second spacer 143 (for example including silicon oxide), and a third spacer 145 (for example including silicon nitride) stacked sequentially on the sidewall of each of the bit lines 160, but is not limited thereto.

Figure 9:
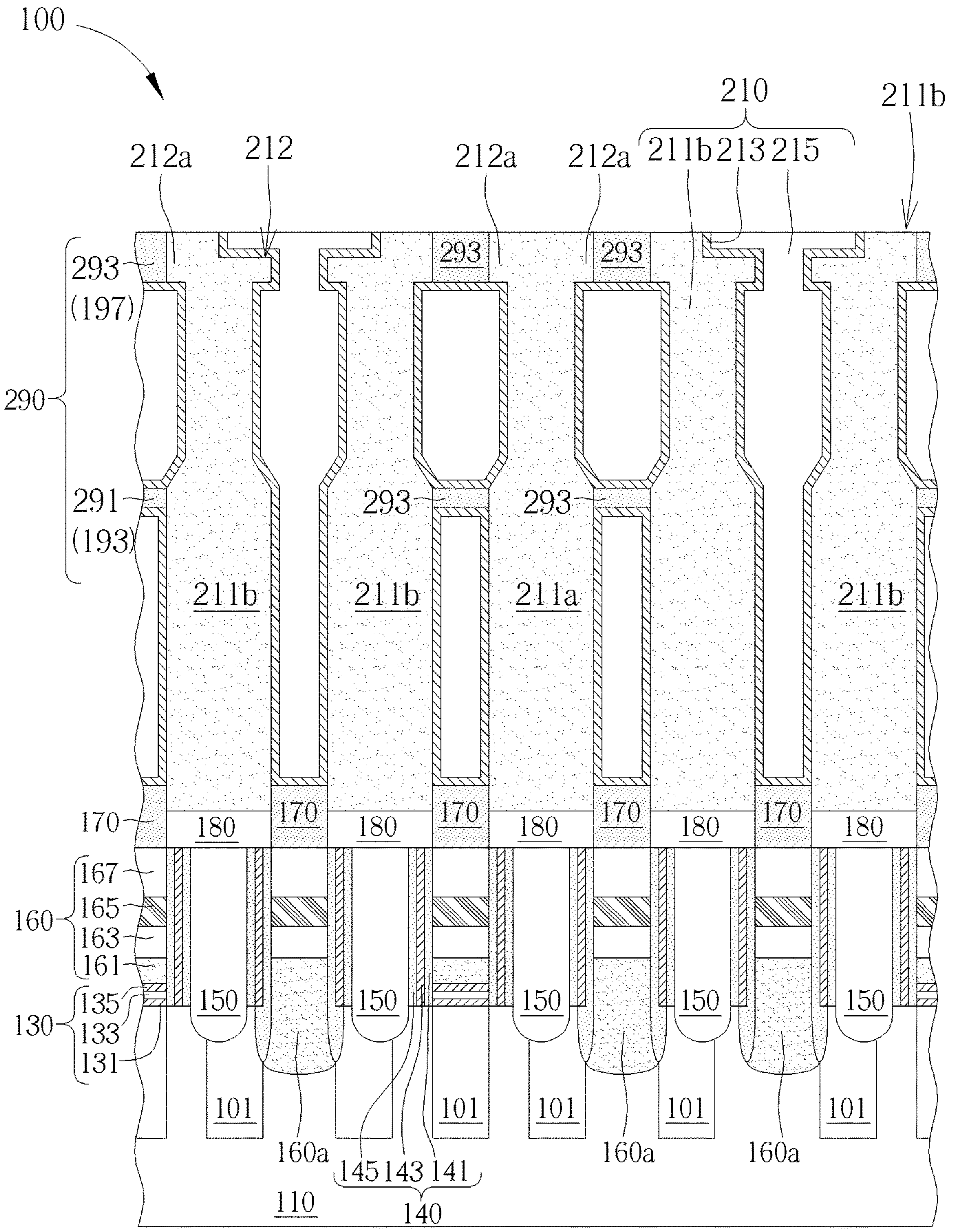

Please further refer to FIG. 1, a plurality of storage node pads (SN pads) 180 is further formed in a dielectric layer 170 over the substrate 110, with each of the storage node pads 180 being disposed over the plugs 150 and the bit lines 160 to in alignment with each of the plugs 150. In one embodiment, the storage node pads 180 also include a low resistant metal material like aluminum, titanium, copper, or tungsten, and preferably include a metal material which is different from that of the plugs 150, but not limited thereto. In another embodiment, the storage node pads 180 and the plugs 150 may also be monolithic optionally, to include the same material thereby. Then, a capacitor structure 210 as shown in FIG. 9 is formed on the storage node pads 180. In one embodiment, the formation of the capacitor structure 210 includes but not limited to the following steps. Firstly, a supporting layer structure 190 is formed on the dielectric layer 170 over the substrate 110, and the supporting layer structure 190 for example includes at least one oxide layer and at least one nitride layer alternately stacked on the dielectric layer 170. In the present embodiment, the supporting layer structure 190 for example includes a first supporting material layer 191 (for example including silicon oxide), a second supporting material layer 193 (for example including silicon nitride or silicon carbonitride), a third supporting material layer 195 (for example including silicon oxide), and a fourth supporting material layer 197 (for example including silicon nitride or silicon carbonitride), but is not limited thereto. Preferably, the oxide layer (for example including the first supporting material layer 191 and the third supporting material layer 195) may include a relative greater thickness, for example being about 5 times to 10 times greater than that of the nitride layer (such as the second supporting material layer 193 and the fourth supporting material layer 197), and the nitride layer (such as the fourth supporting material layer 197) disposed away from the substrate 110 may include a relative greater thickness than that of the nitride layer (such as the second supporting material layer 193) disposed closed to the substrate 110, as shown in FIG. 1, but not limited thereto. Through these arrangements, the entire thickness of the supporting layer structure 190 may achieve about 1600 angstroms to 2000 angstroms, but is not limited thereto. People in the art should fully understand that the practical number of the aforementioned oxide layer (for example the first supporting material 191 and the third supporting material layer 195) and the aforementioned nitride layer (for example the second supporting material layer 193 and the fourth supporting material layer 197) is not limited to be above mentioned number, and which may be further adjusted based on practical product requirements, for example being three layers, four layers or other number. After that, a plurality of openings 192 is formed in the supporting layer structure 190, to penetrate through the fourth supporting material layer 197, the third supporting material layer 195, the second supporting material layer 193, and the first supporting material layer 191 to in alignment with each of the storage node pads 180 underneath. Then, the top surface of each of the storage node pads 180 may therefore be exposed from each opening 192, as shown in FIG. 1.

Figure 2:
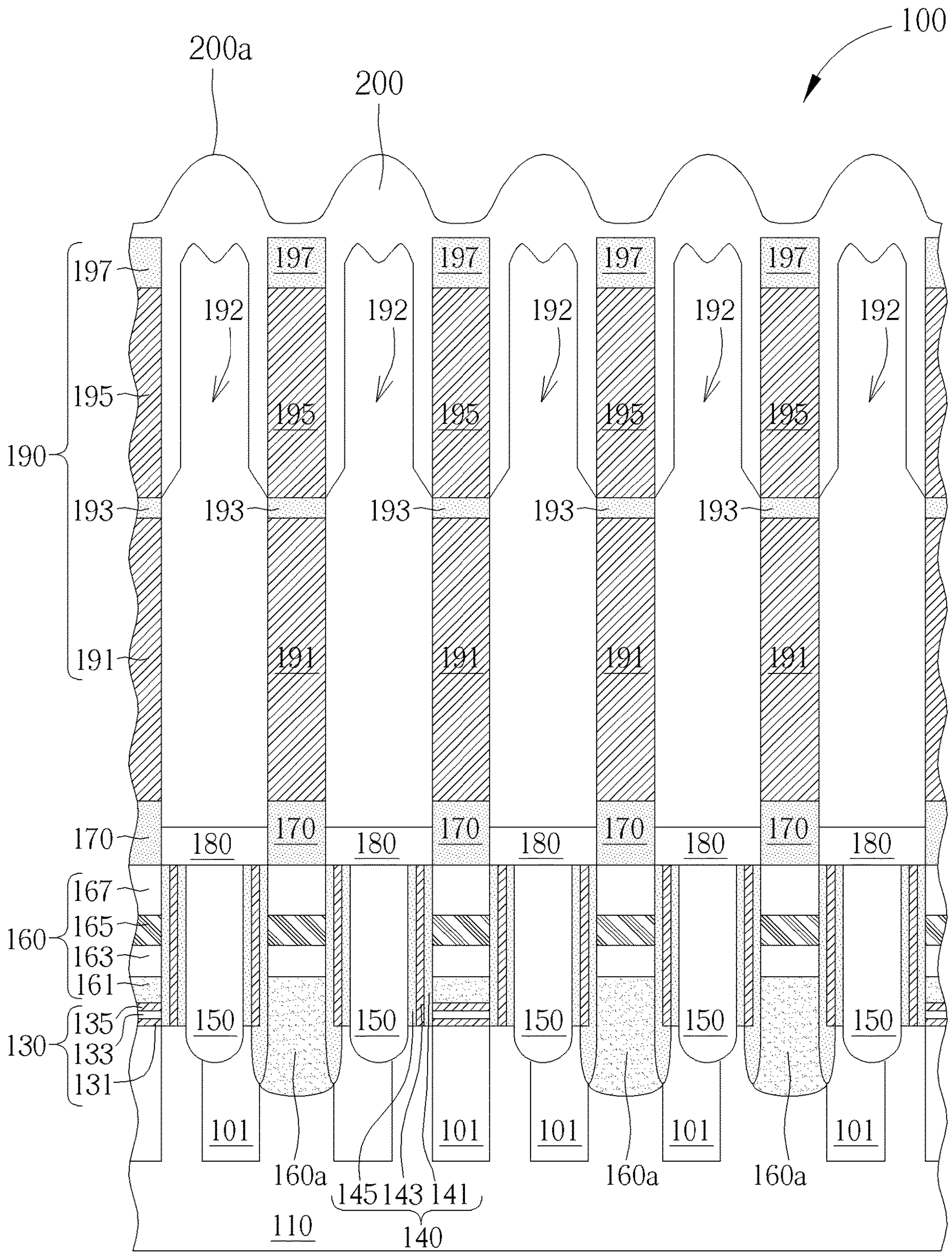

Next, as shown in FIG. 2, a deposition process with a poor step coverage is performed on the substrate 110 to form a sacrificial material layer 200. Precisely speaking, the sacrificial material layer 200 for example includes a dielectric material like silicon oxide, silicon nitride, or silicon oxynitride, and which is conformally formed on surfaces of the openings 192. However, due to the high aspect ratio of the openings 192, the sacrificial material layer 200 only partially covers the sidewalls at an upper portion of each opening 192, to form an overhang portion 200*a* at the upper portion and to seal each opening 192 thereby. It is noted that, the coverage areas of the sacrificial material layer 200 on the surfaces of each opening 192 may be further adjusted by changing the parameters of the deposition process, such as the deposition temperature, the flowing field or a selected material. In the present embodiment, the sacrificial material layer 200 for example covers the surfaces of each opening 192 till the boundary between the third supporting material layer 195 and the second supporting material layer 193, but not limited thereto. Furthermore, although the sacrificial material layer 200 of the present embodiment is exemplified by covering the same surface area of each opening 192, and the practical coverage areas are not limited thereto and which may be further adjusted by changing the aforementioned parameters of the deposition process, for example with the sacrificial material layer having various coverage areas in each opening 192.

Figure 3:
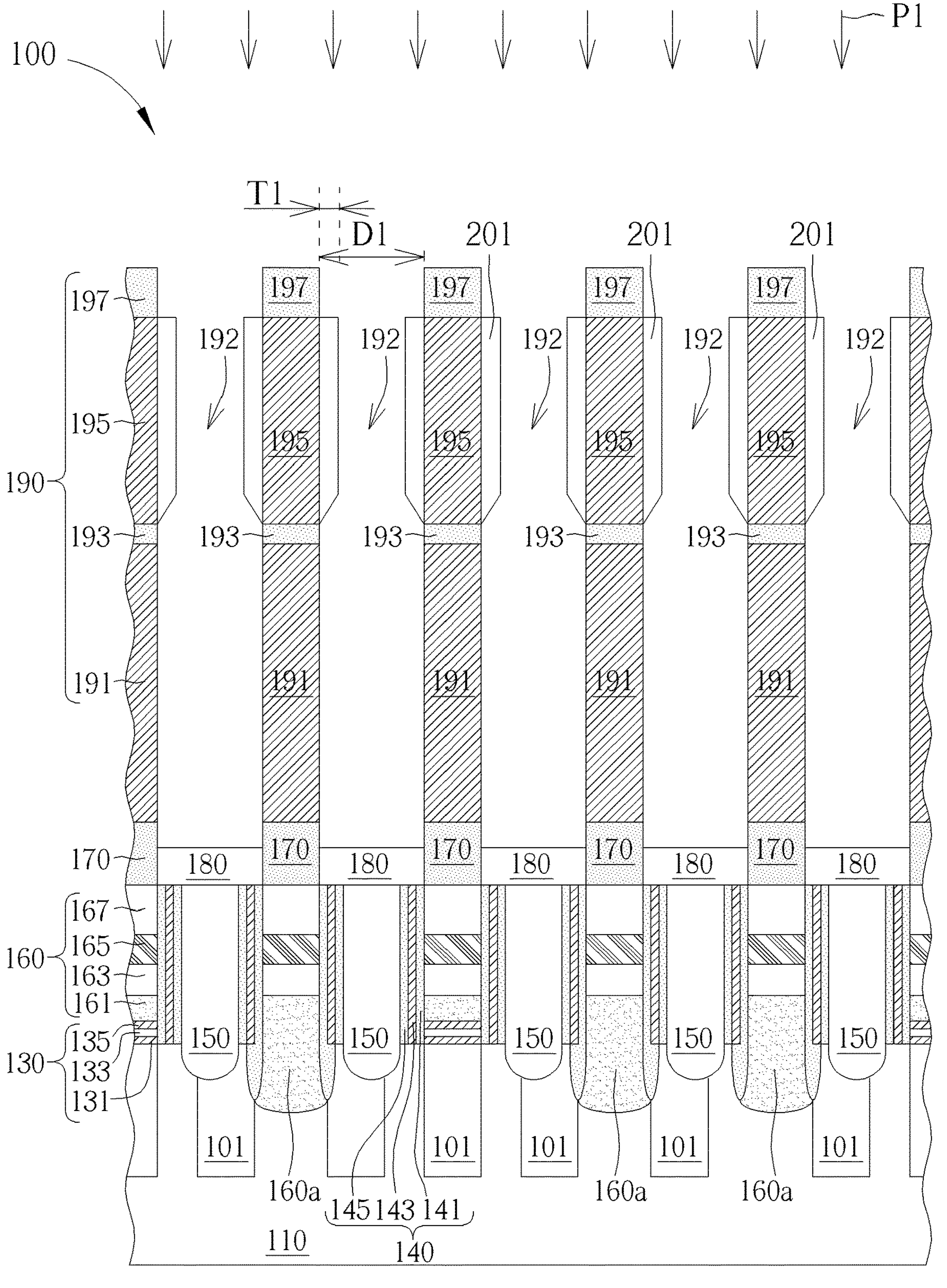

Then, as shown in FIG. 3, a first etching process P1 for example a dry etching process is performed, to partially remove the sacrificial material layer 200 and the overhang portion 200*a*, to form sacrificial layers 201 only covered on two opposite sidewalls of each opening 192. Preferably, the top surface of the sacrificial layers 201 is lower than the top surface of the fourth supporting material layer 197, for example being coplanar with the bottom surface of the fourth supporting material layer 197, thereby unsealing each opening 192, as shown in FIG. 3. Due to the poor step coverage of the aforementioned deposition process, the sacrificial layers 201 covered on the surfaces of each opening 192 may therefore obtain a gradually shrunk thickness at the bottom portion thereof, and a uniform thickness T1 at the upper portion thereof. It is noted that the thickness T1 may be further adjusted according to each parameter such as the depositing temperature, the flowing field or the selected material of the aforementioned deposition process, and the thickness T1 of the sacrificial layers 201 in the present embodiment is for example one five to one ten of a diameter D1 of the opening 192, but is not limited thereto. Furthermore, in another embodiment, the sacrificial layer covered on the surface of each opening 192 may also include uniform thicknesses (not shown in the drawing) different from each other at the upper portion thereof, by optionally controlling each aforementioned parameter.

Figure 4:
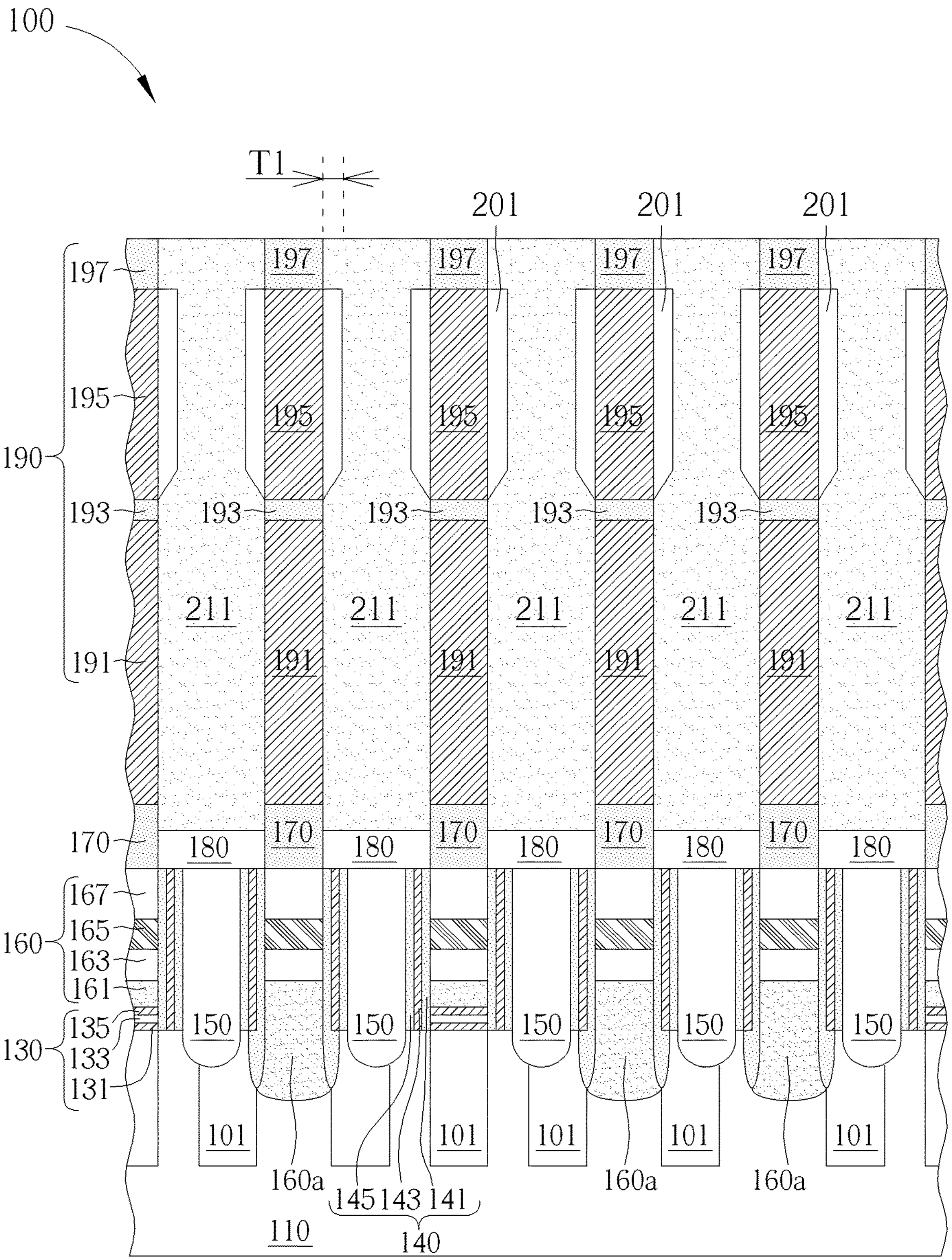

As shown in FIG. 4, a deposition process and an etching back process are sequentially performed on the substrate 110 to form a plurality of columnar bottom electrodes 211, filled in the rest space of each opening 192 to directly in contact with the storage node pads 180 underneath, respectively. Accordingly, the sacrificial layers 201 formed in the aforementioned process are disposed on two opposite sidewalls of the upper portion of each of the columnar bottom electrodes 211, between each of the columnar bottom electrodes 211 and the third supporting material layer 195 of the supporting layer structure 190. Then, each of the columnar bottom electrodes 211 may therefore obtain a vertical and symmetric columnar structure with a narrow top and a wide bottom, but not limited thereto. In one embodiment, the columnar bottom electrodes 211 for example include a low resistant metal material, such as aluminum, titanium, copper, or tungsten, and preferably include titanium, but not limited thereto.

Figure 5:
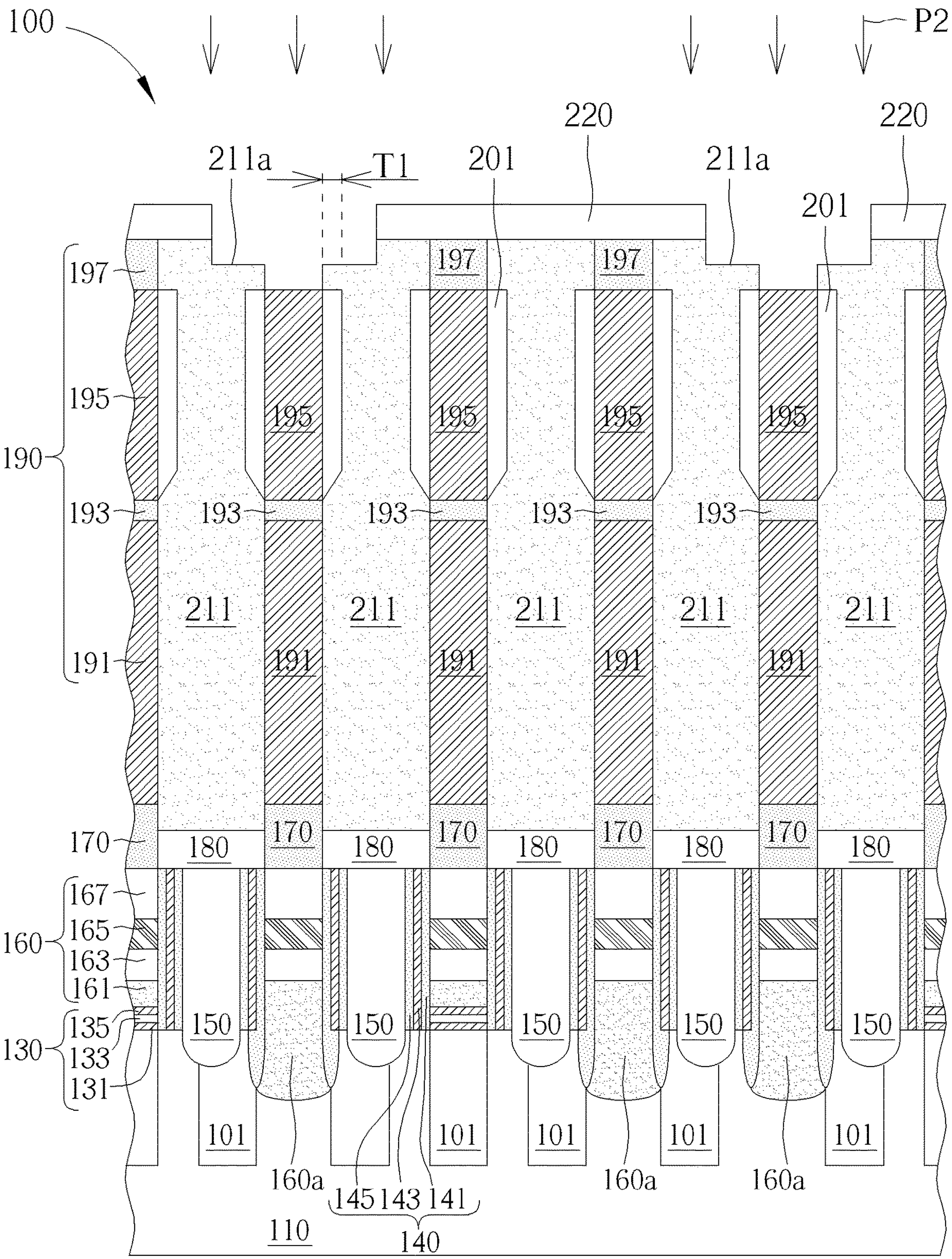

Next, as shown in FIG. 5, a plurality of mask patterns 220 is formed on the substrate 110, covering a part of the fourth supporting material layer 197 and a part of the columnar bottom electrodes 211, and a second etching process P2 such as another dry etching process is performed through the mask patterns 220. Precisely speaking, each of the mask patterns 220 is formed on the supporting layer structure 190 by simultaneously covering any one of the columnar bottom electrodes 211 and the supporting layer structure 190 at two sides thereof, and exposing two columnar bottom electrodes 211 adjacent to the one of the columnar bottom electrodes 211, such that, the mask patterns 220 cover a part of the fourth supporting material layer 197 and a part of the columnar bottom electrodes 211, to expose the rest part of the fourth supporting material layer 197 and the rest part of the columnar bottom electrodes 211. Accordingly, through performing the second etching process P2 via the mask patterns 220, the rest part of the fourth supporting material layer 197 may be removed to expose the third supporting material layer 195 underneath, and the rest part of the columnar bottom electrodes 211 may be partially removed till having a top surface lower than the top surface of the fourth supporting material layer 197. With such arrangement, the upper portion of rest part of the columnar bottom electrodes 211 may be etched to form a recessed corner 212, as shown in FIG. 5.

Figure 6:
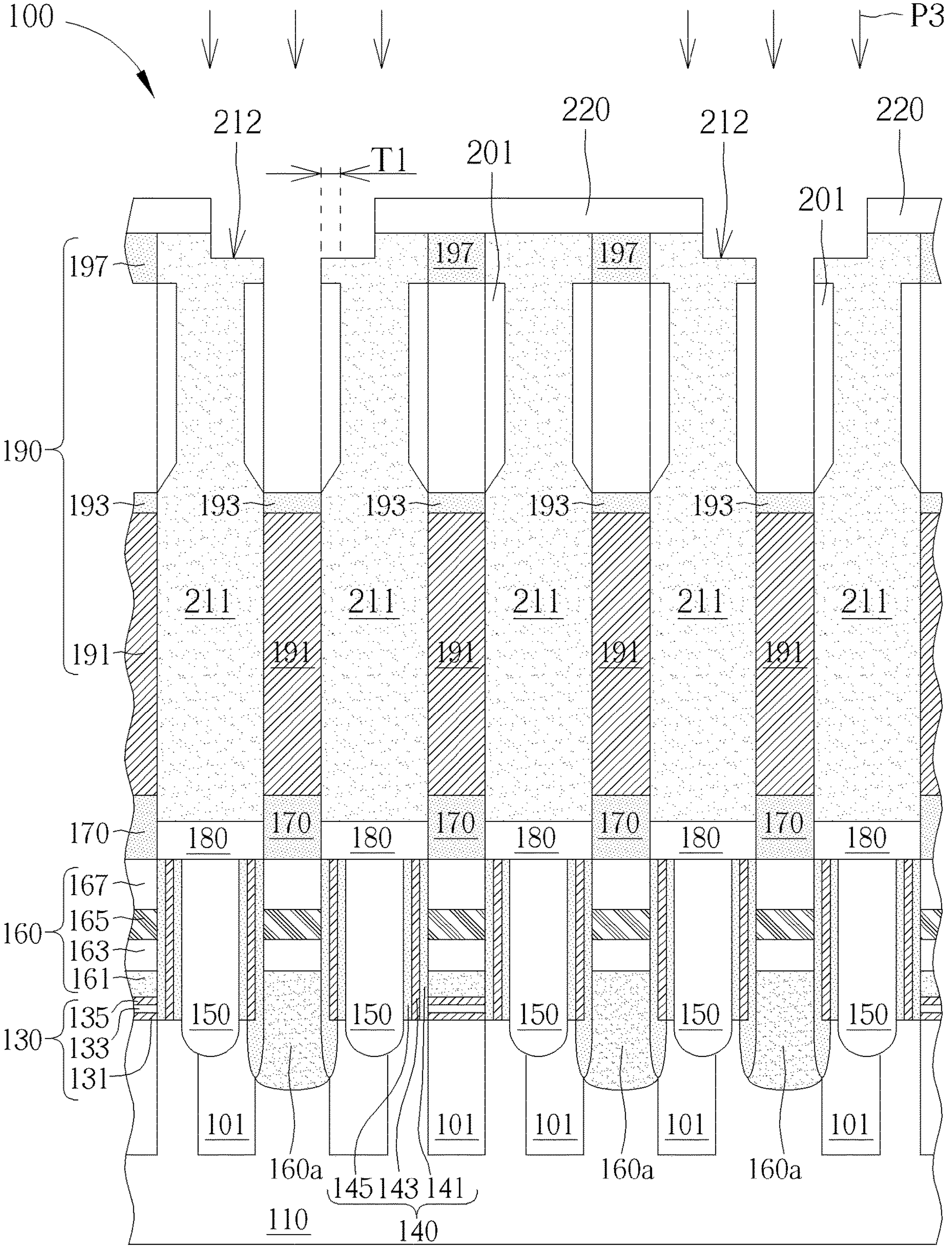

Then, as shown in FIG. 6, a third etching process P3 such as an isotropic wet etching process is performed through the mask patterns 220, to completely remove the third supporting material layer 195 of the supporting layer structure 190 under the coverage of the mask patterns 220. Precisely speaking, the isotropic wet etching process is performed by introducing an etchant like tetramethylammonium hydroxide (THAM), with the third supporting material layer 195 exposed from the mask patterns 220 being firstly removed to expose the second supporting material layer 193 underneath and the sacrificial layer 201, and with the rest part of the third supporting material layer 195 being further removed, but not limited thereto. With these performances, at least a single sidewall of each sacrificial layer 201 may be completely exposed as shown in FIG. 6.

Figure 7:
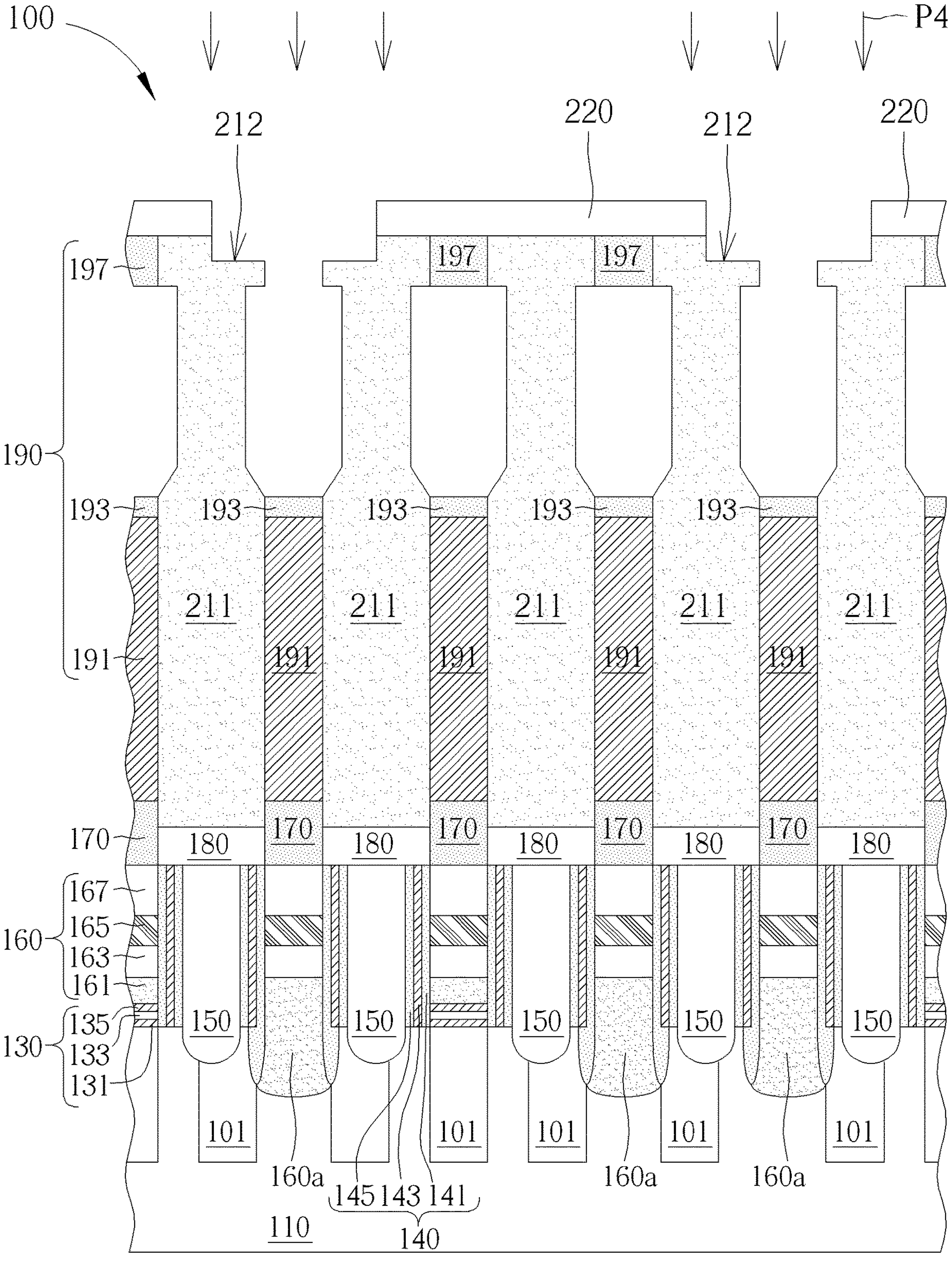

Next, as shown in FIG. 7, a fourth etching process P4 such as another isotropic wet etching process is further performed through the mask patterns 220, by introducing the same etchant like tetramethylammonium hydroxide to remove the sacrificial layer 201 through the exposed sidewall thereof. Accordingly, after removing the sacrificial layer 201, each of the columnar bottom electrodes 211 may therefore obtain two recess portions on the opposite sidewalls of each columnar bottom electrode 211, in particular on the upper portion of the opposite sidewalls of each columnar bottom electrode 211, with the two recess portions extending below the bottom surface of the fourth supporting material layer 197 in a vertical direction (for example in the direction perpendicular to the substrate 110), and being symmetric with each other. In the present embodiment, the recess portion refers to at least one recess area on the sidewalls of the columnar bottom electrodes 211 caused by the removal of the sacrificial layer 201.

Figure 8:
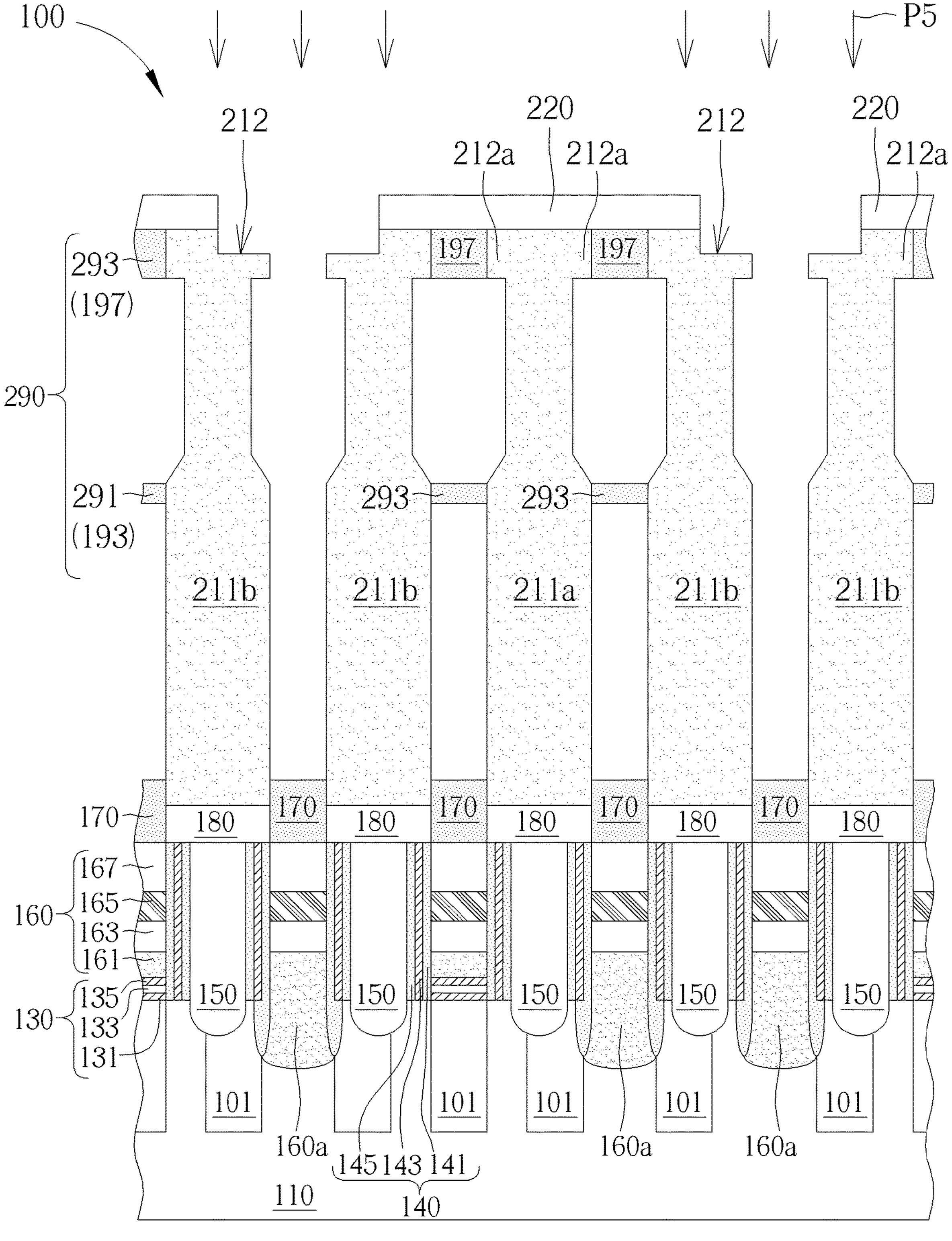

As shown in FIG. 8, a fifth etching process P5 such as another isotropic wet etching process is performed through the mask patterns 220, by introducing the same etchant like tetramethylammonium hydroxide to firstly remove the exposed second supporting material layer 193 and the first supporting material layer 191 underneath, till exposing the top surface of the dielectric layer 170, and to further etch the rest first supporting material layer 191 at two sides, but not limited thereto. With these performances, two opposite sidewalls of each columnar bottom electrode 211 may be substantially exposed, and the rest second supporting material layer 193 and the rest fourth supporting material layer 197 may respectively form a first supporting layer 291 and a second supporting layer 293 disposed from bottom to top. The first supporting layer 291 and the second supporting layer 293 are at least disposed at one side of each columnar bottom electrode 211, to together form a supporting structure 290 for supporting the columnar bottom electrodes 211. Preferably, a thickness of the second supporting layer 293 which is disposed away from the substrate 110 is greater than that of the first supporting layer 291 which is disposed close to the substrate 110, for example being about 2 to 5 times greater than the thickness of the first supporting layer 291, as shown in FIG. 8, but not limited thereto.

Under the influence of the sacrificial layers 201, the upper portion of each columnar bottom electrode 211 may partially include a relative smaller diameter, for example being smaller than the diameter D1 of the opening 192, and the bottom portion of each columnar bottom electrode 211 may include a relative greater diameter, for example being equal to the diameter D1 of the opening 192. Then, each of the columnar bottom electrodes 211 may substantially present in a vertical columnar structure with a narrow top and a wide bottom, as shown in FIG. 8, but not limited thereto. In the present embodiment, a portion of each columnar bottom electrode 211 where disposed between the first supporting layer 291 and the second supporting layer 293 in the vertical direction is defined as the upper portion, and where disposed between the first supporting layer 291 and the storage node pads 180 in the vertical direction is defined as the lower portion, but not limited thereto. It is noted that, in the present embodiment, the columnar bottom electrodes 211 further include first columnar bottom electrodes 211*a* having a symmetric columnar structure and second columnar bottom electrodes 211*b* having an asymmetric columnar structure, and the upper portion of each of the secondo columnar bottom electrodes 211*b* further includes the recessed corner 212, so as to present in the asymmetric structure. It is also noted that, the upper portion of each of the columnar bottom electrodes 211 (including the first columnar bottom electrodes 211*a* and the second columnar bottom electrodes 211*b*) further include at least one horizontal extending portion 212*a* along a horizontal direction (for example the direction horizontal to the substrate 110), and a bottom surface of the horizontal extending portion 212*a* is coplanar with the bottom surface of the second supporting layer 293, as shown in FIG. 8. The first columnar bottom electrodes 211*a* each includes two of the horizontal extending portions 212*a* extended along two opposite directions, thereby present in the symmetric structure, and the second columnar bottom electrodes 211*b* each includes only one horizontal extending portion 212*a* extended toward the left side or the right side, thereby present in the asymmetric structure. With such arrangement, the distances between the adjacent columnar bottom electrodes 211 may be enlarged, so as to facilitate the performing of the subsequent deposition process.

Then, as shown in FIG. 9, the mask patterns 220 are completely removed, and a deposition process is performed on the substrate 110, to sequentially form a capacitor dielectric layer 213 and a top electrode layer 215, so that, the columnar bottom electrodes 211 (including the first columnar bottom electrodes 211*a* and the second columnar bottom electrodes 211*b*), the capacitor dielectric layer 213 and the top electrode layer 215 may together form the capacitor structure 210. Precisely speaking, the capacitor dielectric layer 213 is conformally covered on the exposed surfaces of the columnar bottom electrodes 211 and the dielectric layer 170, and the top electrode layer 215 is filled in the rese space between each columnar bottom electrode 211, with a portion of the capacitor dielectric layer 213 and a portion of the top electrode layer 215 further fill between the second supporting layer 293 and the first supporting layer 291, and between the first supporting layer 291 and the dielectric layer 170. The capacitor dielectric layer 213 may directly contact the bottom surface of the horizontal extending portion 212*a*. In other words, each horizontal extending portion 212*a* of the columnar bottom electrodes 211 may be disposed over a portion of the capacitor dielectric layer 213, and the capacitor structure 210 may therefore obtain a more reliable structure. In one embodiment, the capacitor dielectric layer 213 for example includes a high-k dielectric material, which is selective from a group consisted of hafnium oxide ($HfO_2$), hafnium silicon oxide ($HfSiO_4$), hafnium silicon oxynitride (HfSiON), zinc oxide ($ZrO_2$), titanium oxide ($TiO_2$) and zirconia-alumina-zirconia (ZAZ), and preferably includes zirconia-alumina-zirconia, and the top electrode layer 215 for example includes a low resistant metal material like aluminum, titanium, copper, or tungsten, and preferably includes titanium, but not limited thereto.

Through these performances, the fabrication of capacitor structure 210 is accomplished thereby. The capacitor structure 210 includes a plurality of vertically extended capacitors, to serve as storage nodes (SNs) of the semiconductor device 100. The storage nodes are allowable to be electrically connected to a transistor (not shown in the drawings) of the semiconductor device 100 through the storage node pads 180 and the storage node contacts (namely the plugs 150), so that, the capacitor structure 210 may therefore gain better contact relationship with the storage node contacts disposed on the substrate 110. In this way, the semiconductor device 100 of the present embodiment may form a dynamic random access memory (DRAM) device, which includes at least one transistor (not shown in the drawings) and at least one capacitor, thereto serve as the smallest unit in the DRAM array for accepting signals from the bit lines 160 and the buried word lines during the operation.

According to the fabricating method of the first embodiment of the present disclosure, the deposition process with poor stepped coverage (as shown in FIG. 2) and the first etching process P1 (as shown in FIG. 3) are performed to form the sacrificial layers 201 only disposed on two opposite sidewalls of each opening 192, and then, each columnar bottom electrode 211 formed subsequently may therefore obtain a vertical columnar structure with a narrow top and a wide bottom, to primary enlarge the distance between the adjacent columnar bottom electrodes 211. After that, while removing the third supporting material layer 195 of the supporting layer structure 190 (as shown in FIG. 5 and FIG. 6), the recessed corner 212 is further formed on the upper portion of a part of the columnar bottom electrodes 211 through the mask patterns 220, so as to form the second columnar bottom electrode 211*b* with the asymmetric structure, thereby further enlarging the distance between the second columnar bottom electrodes 211*b* and other columnar bottom electrodes 211 adjacent thereto. Then, the deposition process of the capacitor dielectric layer 213 and the top electrode layer 215 may be smoothly performed in the subsequent process thereby. With these arrangements, the fabricating method of the semiconductor device 100 according to the first embodiment enables to effectively improve the structural defect caused by shrinking the density of the memory cells, so that, the capacitor dielectric layer 213 and the top electrode layer 215 formed subsequently may be further uniform and plat covered on each columnar bottom electrodes 211. Thus, the capacitor structure 210 may therefor obtain a more reliable structure to achieve preferably functions and performances. It is noted that the first columnar bottom electrodes 211*a* each includes two of the horizontal extending portions 212*a* extended along two opposite directions, and the second columnar bottom electrodes 211*b* each includes only one horizontal extending portion 212*a* extended toward the left side or the right side, with each of the horizontal extending portions 212*a* disposed over the portion of the capacitor dielectric layer 213, the capacitor structure 210 will therefore obtain a more reliable structure. Accordingly, the supporting structure 290 will be more stably disposed at two sides of the capacitor structure 210, to improve the structural reliability of the semiconductor device 100.

People well known in the arts should easily realize the semiconductor device and the fabricating method thereof in the present disclosure is not limited to the aforementioned embodiment, and may further include other examples or variety. For example, in another embodiment, the parameters of the aforementioned deposition process may be adjusted to form the sacrificial layers 201 as shown in FIG. 3 directly, instead of firstly forming the overhang portion 200*a* as shown in FIG. 2. Then, the aforementioned first etching process P1 may be omitted thereby. The following description will detail the different embodiments of the semiconductor device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 10:
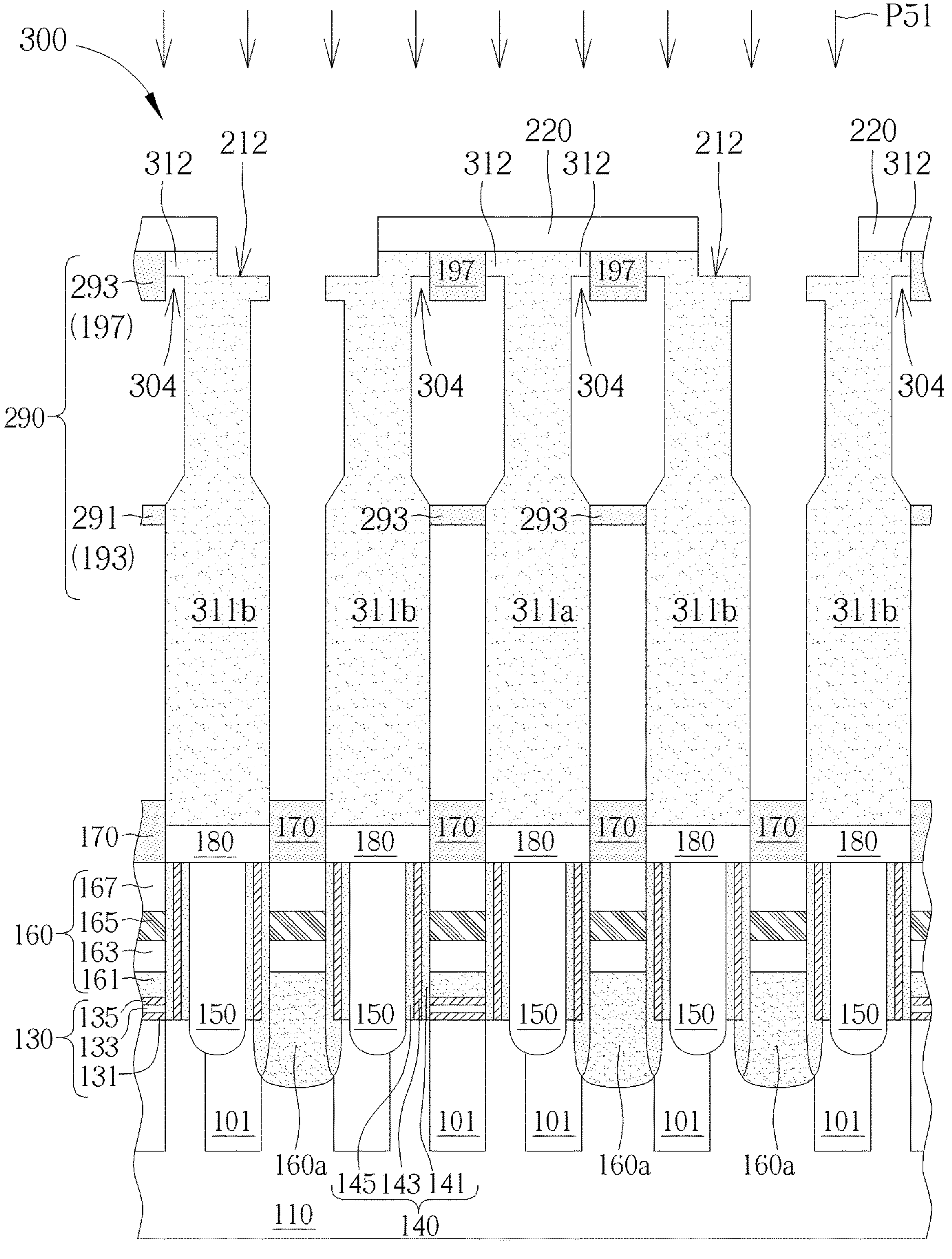
Figure 11:
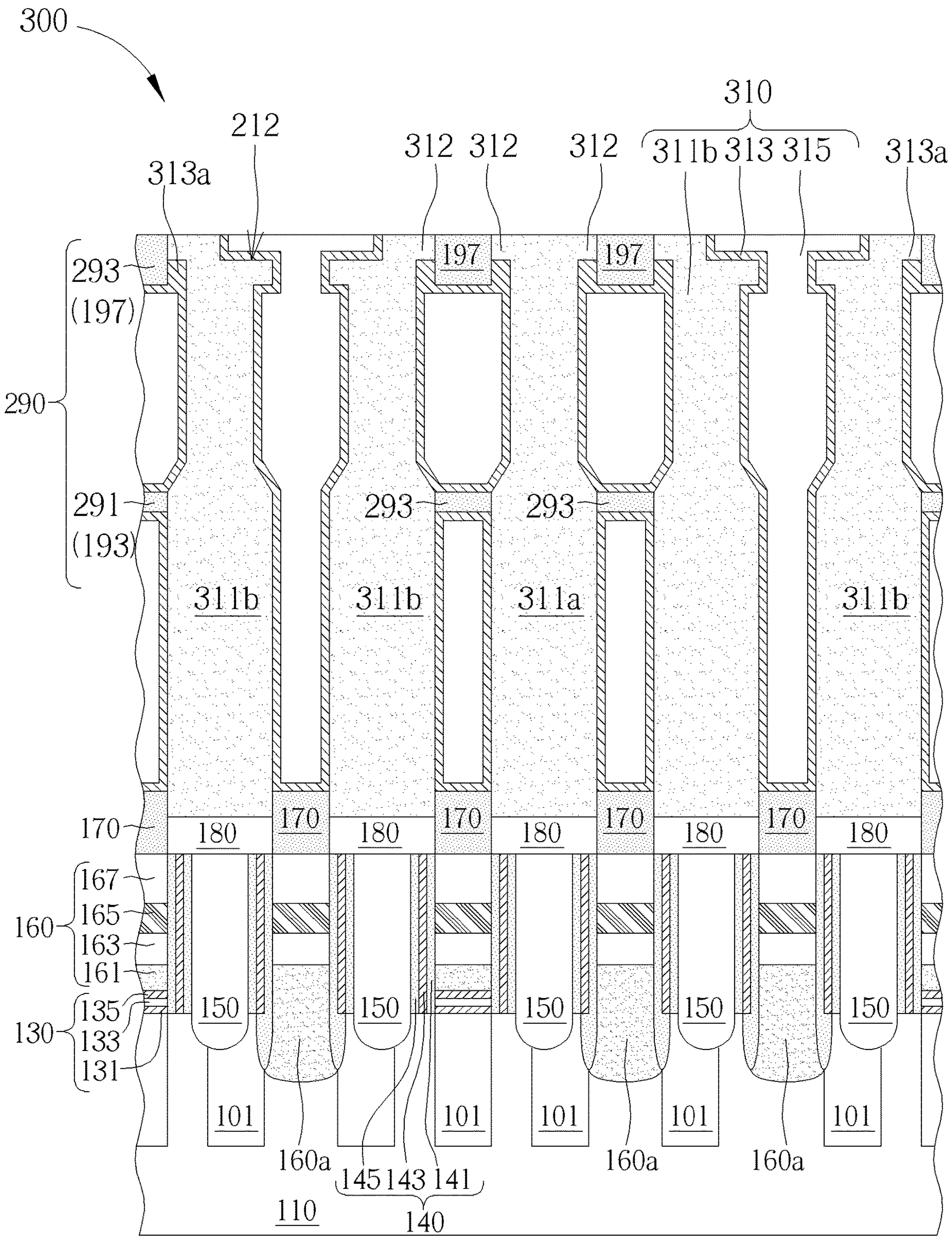
Figure 12:
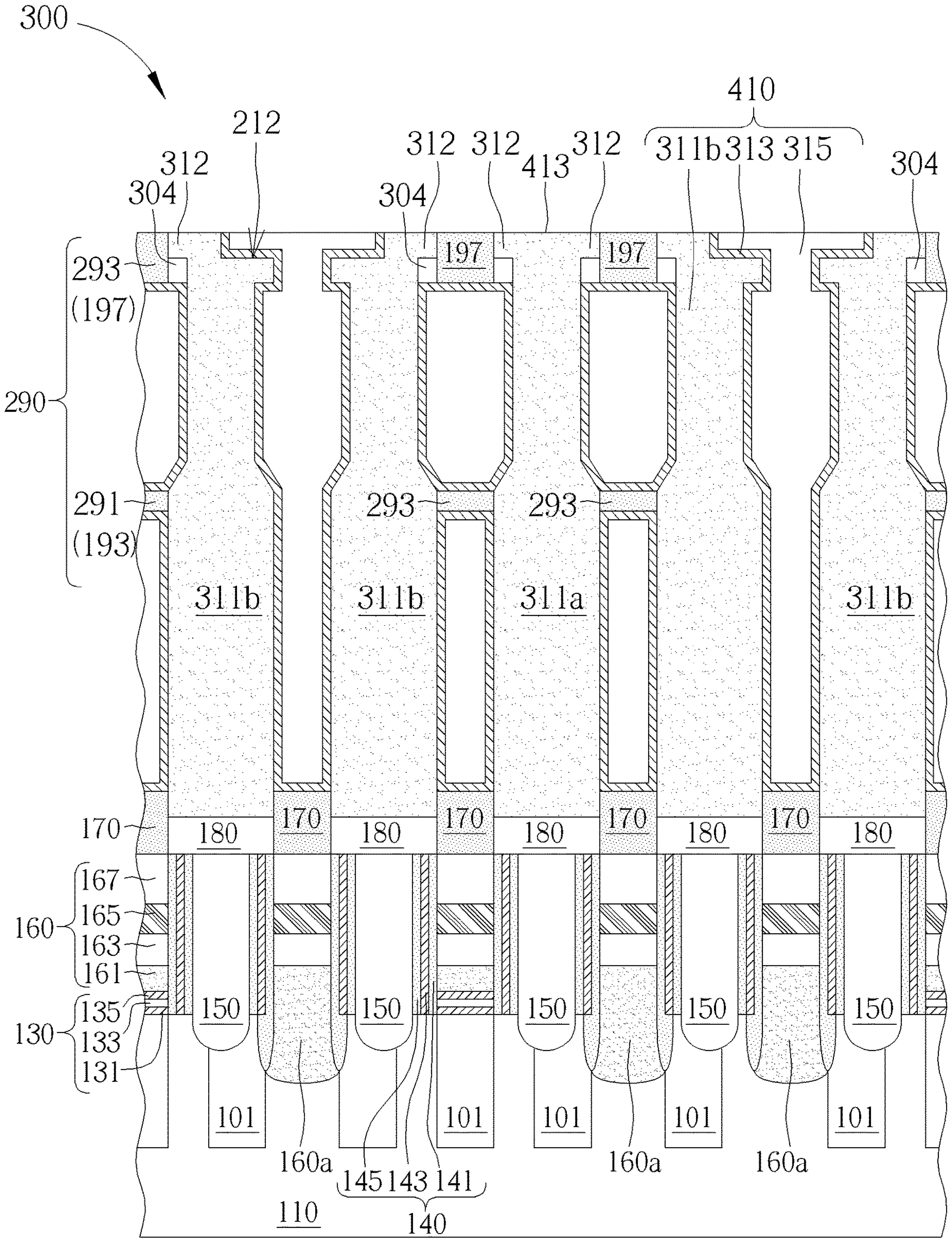

Please refer to FIG. 10 to FIG. 12, which illustrate schematic diagrams of a fabricating method of a semiconductor device 300 according to the second embodiment in the present disclosure. The forming processes at the front end of the semiconductor device 300 in the present embodiment are substantially the same as those of the semiconductor device 100 in the aforementioned first embodiment, as shown in FIG. 1 to FIG. 6, and all the similarities will not be redundantly described herein after. The difference between the present embodiment and the aforementioned first embodiment is in that in the present embodiment, the top surface of the sacrificial layer (not shown in the drawings) is located between the bottom surface and the top surface of the fourth supporting material layer 197 as shown in FIG. 3, so that, an air gap 304 may be formed between each of the columnar bottom electrodes 311 and the fourth supporting material layer 197, after completely removing the sacrificial layer (for example in the fourth etching process P4 as shown in FIG. 7), as shown in FIG. 10. Following these, a fifth etching process P51 is performed on the substrate 110, the mask patterns 220 are then removed, and the rest second supporting material layer 193 and the rest fourth supporting material layer 197 may together form the supporting structure 290. Accordingly, the upper portion of each of the columnar bottom electrodes 311 (including the first columnar bottom electrodes 311*a* and the second columnar bottom electrodes 311*b*) of the present embodiment also includes at least one horizontal extending portion 312 along a horizontal direction (for example in the direction horizontal to the substrate 110), and a bottom surface of the horizontal extending portion 312 is higher than the bottom surface of the second supporting layer 293, and is between the bottom surface and the top surface of the second supporting layer 293, as shown in FIG. 10. Likewise, each of the first columnar bottom electrodes 311*a* includes two of the horizontal extending portions 312 respectively extended along two opposite directions to present in a symmetric columnar structure, and each of the second columnar bottom electrodes 311*b* includes only one horizontal extending portion 312 extended toward the right side or the left side, so as to present in an asymmetric columnar structure. In this way, the distance between the adjacent columnar bottom electrodes 311 may also be further enlarged to facilitate the performing of the subsequent deposition process.

Then, as shown in FIG. 11, a capacitor dielectric layer 313 and a top electrode layer 315 are sequentially formed on the columnar bottom electrodes 311, and the columnar bottom electrodes 311, the capacitor dielectric layer 313 and the top electrode layer 315 may together form a capacitor structure 310, wherein the materials, as well as the practical formation of the capacitor dielectric layer 313 and/or the top electrode layer 315 are substantially the same as the capacitor dielectric layer 213 and/or the top electrode layer 215 of the aforementioned first embodiment, and those will not be redundantly described hereinafter. It is noted that in the present embodiment, each of the parameters of the aforementioned deposition process (for example the deposition temperature, the flowing field or a selected material) may be optionally adjusted to form a portion of the capacitor dielectric layer 313*a* filled up the air gap 304 between each of the columnar bottom electrodes 311 and the second supporting layer 293. The capacitor dielectric layer 313, 313*a* may also include a high-k dielectric material like hafnium oxide, hafnium silicon oxide, hafnium silicon oxynitride, zinc oxide, titanium oxide or zirconia-alumina-zirconia, and which may further fill in the air gap 304 between the second supporting layer 293 and each of the columnar bottom electrodes 311, to form a more reliable capacitor structure 310 thereby. However, in another embodiment, the capacitor dielectric layer 413 formed subsequently may also not fill in the air gap 304 between each of the columnar bottom electrodes 311 and the second supporting layer 293 optionally, so that, after forming a capacitor structure 410, an air gap 304 is still remained between each of the columnar bottom electrodes 311 and the second supporting layer 293, as shown in FIG. 12.

Through these arrangements, the fabricating method of the capacitor structure 310/410 is accomplished thereby. The capacitor structure 310/410 includes a plurality of vertically extended capacitors, to serve as the storage nodes of the semiconductor device 300. The storage nodes are allowable to be electrically connected to a transistor (not shown in the drawings) of the semiconductor device 300 through the storage node pads 180 and the storage node contacts (namely the plugs 150), so that, the capacitor structure 310/410 may therefore gain better contact relationship with the storage node contacts disposed on the substrate 110. In this way, the semiconductor device 300 of the present embodiment may also form a dynamic random access memory device.

According to the fabricating method of the second embodiment of the present disclosure, the air gap 304 is formed between each of the columnar bottom electrodes 311 and the fourth supporting material layer 197, after the fifth etching process P51 (as shown in FIG. 10), through adjusting the height of the top surface of the sacrificial layer. Then, the capacitor dielectric layer 313/413 may be optionally filled in or not filled in the air gap 304, and a portion of the capacitor dielectric layer 313 or the air gap 304 may be sandwiched between each columnar bottom electrode 311 and the second supporting layer 293, and below the horizontal extending portion 312. Thus, the columnar bottom electrode 311 may be further stably disposed on the supporting structure 290, to improve the structural reliability and the device performances of the semiconductor device 300.

Figure 13:
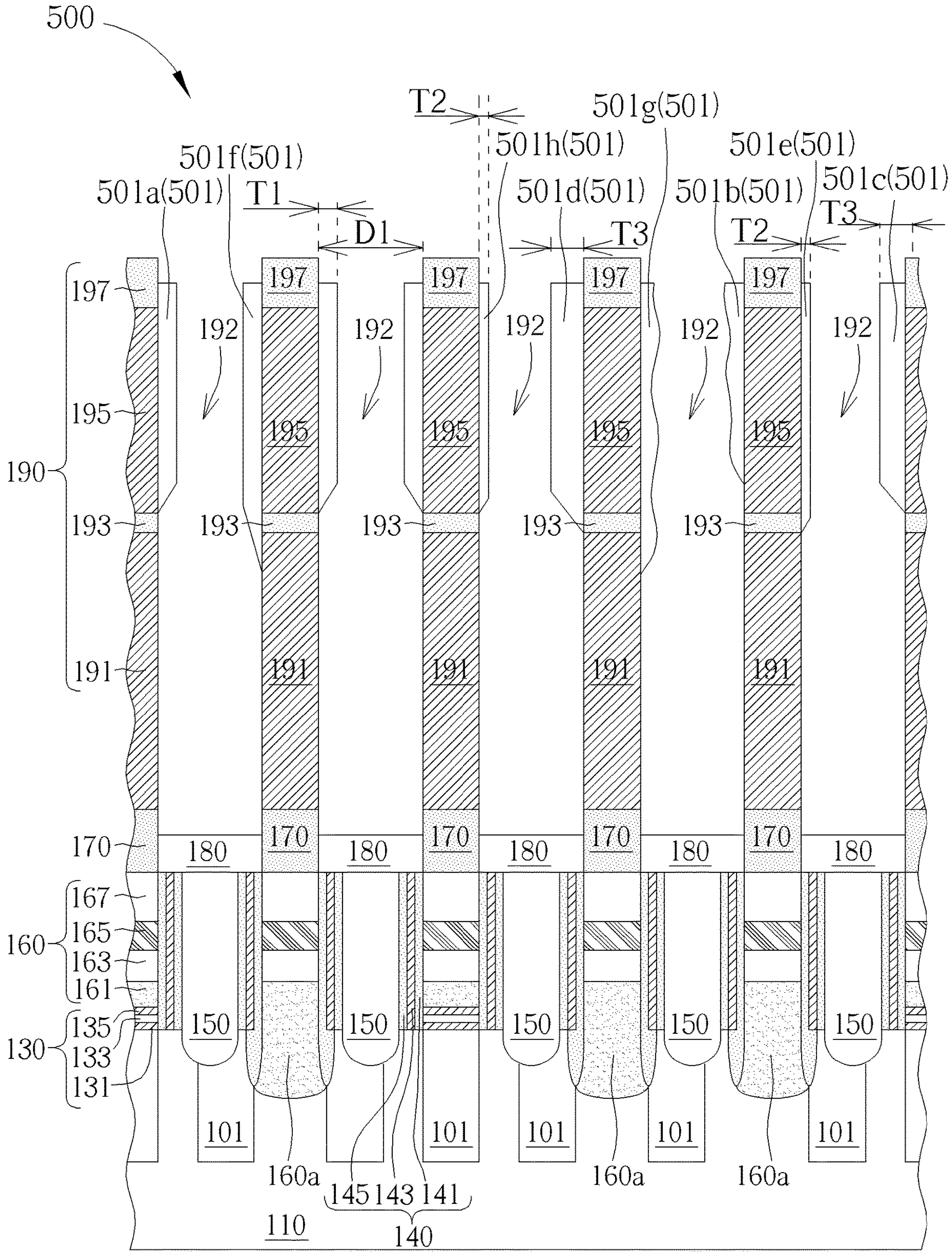
Figure 14:
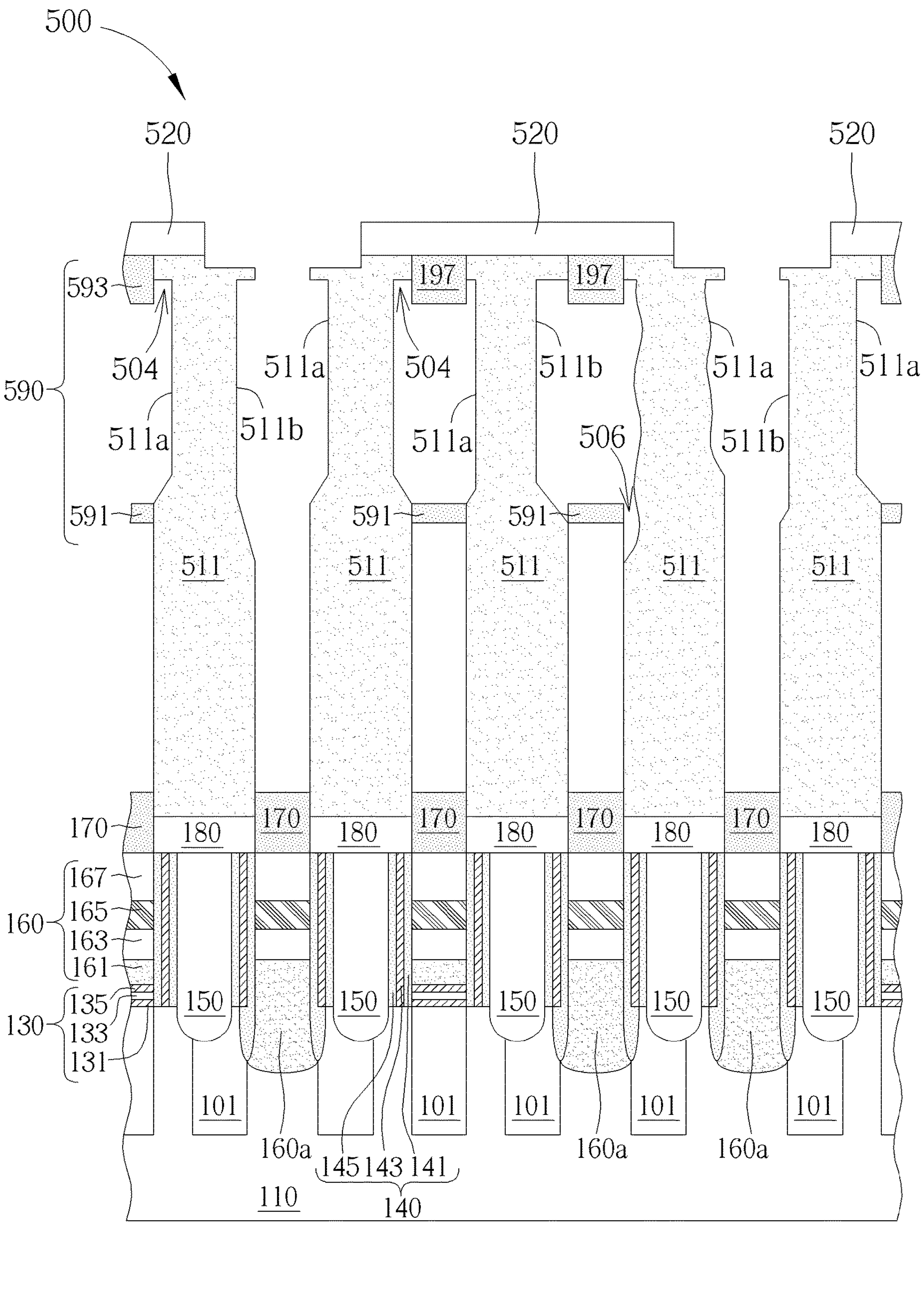
Figure 15:
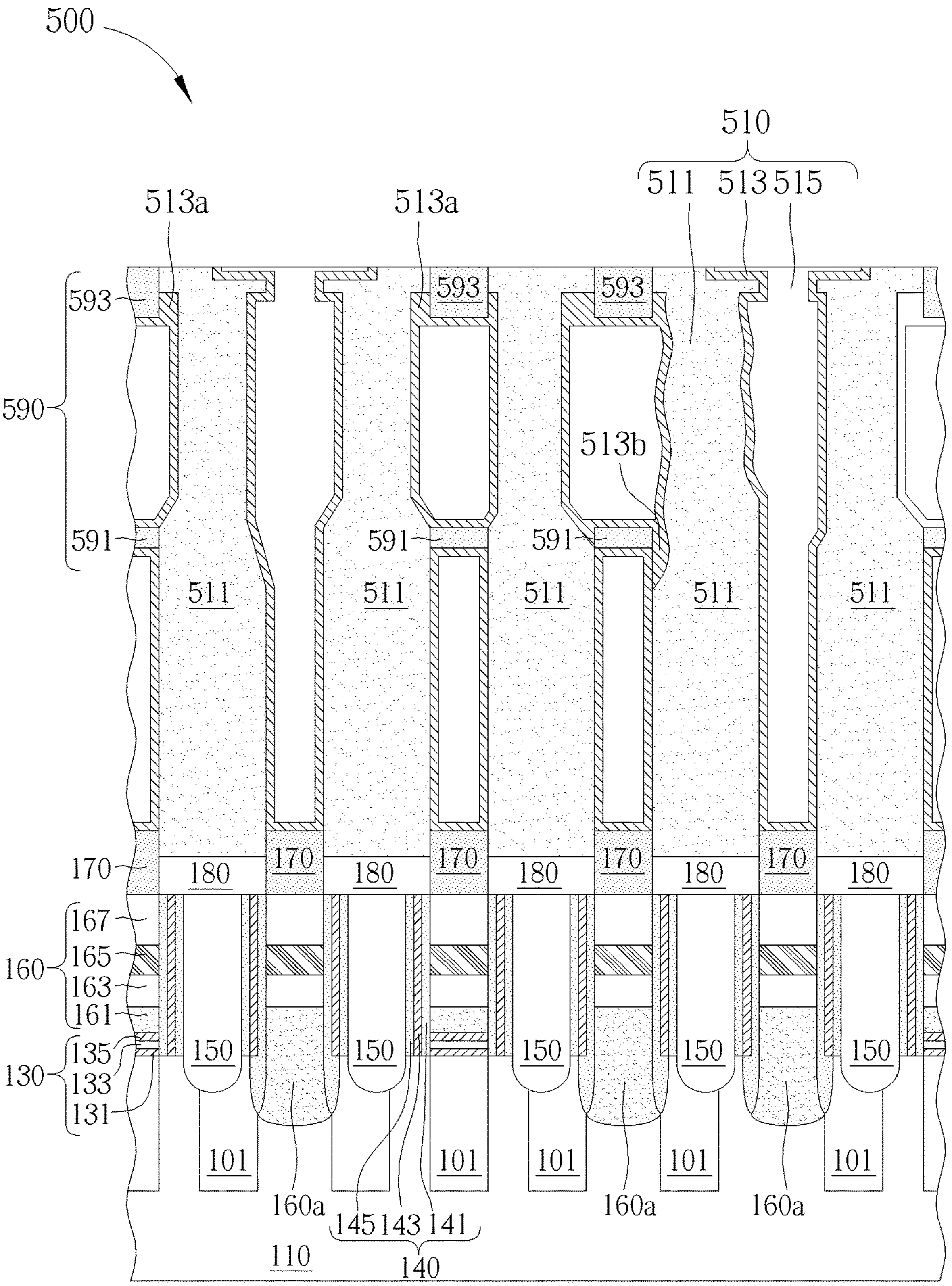

Please refer to FIG. 13 to FIG. 15, which illustrate schematic diagrams of a fabricating method of a semiconductor device 500 according to the third embodiment in the present disclosure. The forming processes at the front end of the semiconductor device 500 in the present embodiment are substantially the same as those of the semiconductor device 100, 300 in the aforementioned embodiments, and all the similarities will not be redundantly described herein after. The difference between the present embodiment and the aforementioned embodiments is in that, the parameters of the deposition process in the present embodiment are adjusted to form sacrificial layers 501 having various thicknesses and various coverage areas on the surfaces of the openings 192 respectively. For example, a part of the sacrificial layers 501*a*, 501*b*, 501*c* is extended till covering a portion of the third supporting material layer 195, another part of the sacrificial layers 501*d*, 501*e* is extended till covering the boundary between the second supporting material layer 193 and the first supporting material layer 191, and another part of the sacrificial layers 501*f*, 501*g* is extended till covering a portion of the first supporting material layer 191, but not limited thereto. Furthermore, a part of the sacrificial layers 501*e*, 501*h* may include a uniform thickness T2 being smaller than the thickness T1, another part of the sacrificial layers 501*c*, 501*d* may include a uniform thickness T3 being greater than the thickness T1, as shown in FIG. 13, but not limited thereto. In another embodiment, a part of the sacrificial layers 501*b*, 501*g* may also include an uneven film, as shown in FIG. 13.

Next, forming the columnar bottom electrodes (as shown in FIG. 4 of the aforementioned first embodiment), forming the mask patterns 520 (as shown in FIG. 5 of the aforementioned first embodiment), sequentially removing a part of the fourth supporting material layer 197 and a part of the columnar bottom electrodes 511 through the mask patterns 520 (as shown in FIG. 5 of the aforementioned first embodiment), removing the third supporting material layer 195 (as shown in FIG. 6 of the aforementioned first embodiment), removing the sacrificial layers 501 (as shown in FIG. 7 of the aforementioned first embodiment), and removing a part of the second supporting material layer 193 and the first supporting material layer 191 are sequentially performed, to form columnar bottom electrodes 511, a first supporting layer 591 (namely, the rest part of the second supporting material layer 193) and the second supporting layer 593 (namely, the rest part of the fourth supporting material layer 197). The first supporting layer 591 and the second supporting layer 593 may together form a supporting structure 590, and an air gap 504 may also be formed between each of the columnar bottom electrodes 511 and the second supporting layer 593.

It is noted that due to the various shapes of each sacrificial layer 501, each of the columnar bottom electrodes 511 of the present embodiment may therefore obtain recess portions 511*a*, 511*b* on the opposite sidewalls of each columnar bottom electrode 511, in particular on the upper portion of the opposite sidewalls of each columnar bottom electrode 511, wherein the recess portions 511*a*, 511*b* are extended from the second supporting layer 593 to the first supporting layer 591 or to below the first supporting layer 591 in the vertical direction. In the present embodiment, the recess portion refers to at least one recess area the sidewalls of the columnar bottom electrodes 511 caused by the removal of the sacrificial layer 501. Precisely, the recess portions 511*a*, 511*b* include an overall flat or irregular surface, an overall uniform or uneven recess, various recesses with different recess degrees in a horizontal direction, various recesses with different recessed shape (such as a waved-shape or an angled shape or the like), or various recesses with different extension lengths or the like. Also, the recess portions 511*a*, 511*b* may also have different vertical or inclined extending portions, different inclined degree or the like. Among them, a part of the columnar bottom electrodes 511 has two recess portions 511*a*, 511*b* being asymmetric to each other, with one of the two recess portions (such as the recess portion 511*a* as shown in FIG. 14) extended from the second supporting layer 593 till the boundary between the first supporting layer 591 and the second supporting layer 593, and with another one of the two recess portions (such as the recess portion 511*b* as shown in FIG. 14) extended from the second supporting layer 593 till being below the first supporting layer 591, thereby forming an air gap 506 between the columnar bottom electrode 511 and the first supporting layer 591. Also, the two recess portions 511*a*, 511*b* may optionally include an overall even or irregular surface, as shown in FIG. 14. Accordingly, each of the columnar bottom electrodes 511 may therefore present in more diverse asymmetric structures. However, in another embodiment, each columnar bottom electrode may also include two recess portions extended below the bottom surface of the second supporting layer 593 in a direction vertical to the substrate 110, with the two recess portions being asymmetric to each other.

Figure 16:
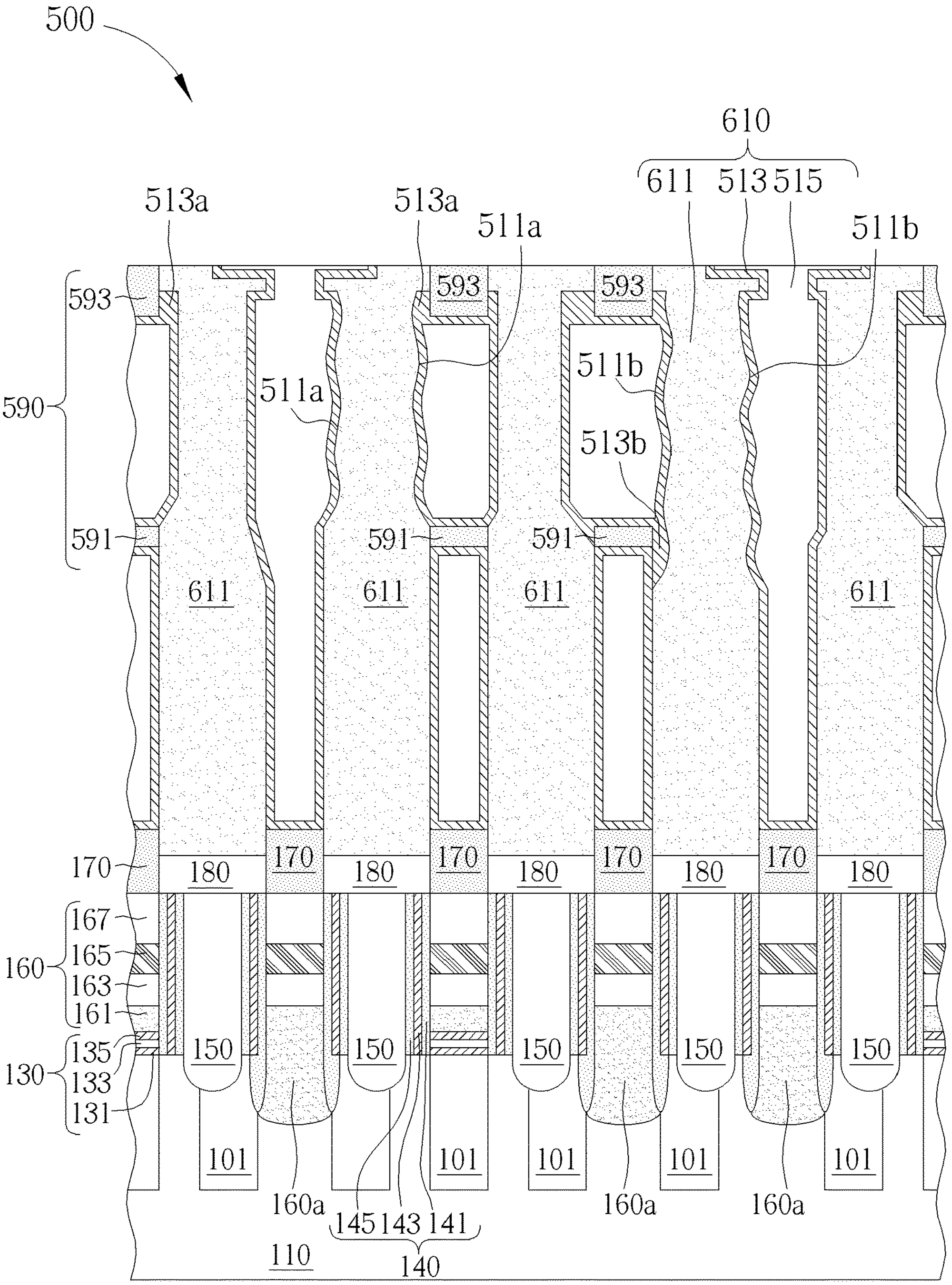

Following these, as shown in FIG. 15, the mask patterns 520 are completely removed, and a capacitor dielectric layer 513 and a top electrode layer 515 are sequentially formed on the columnar bottom electrodes 511, and the columnar bottom electrodes 511, the capacitor dielectric layer 513 and the top electrode layer 515 may together form a capacitor structure 510, wherein the materials, as well as the practical formation of the capacitor dielectric layer 513 and/or the top electrode layer 515 are substantially the same as the capacitor dielectric layer 213 and/or the top electrode layer 215 of the aforementioned first embodiment, and those will not be redundantly described hereinafter. It is noted that, in the present embodiment, each of the parameters of the aforementioned deposition process (for example the deposition temperature, the flowing field or a selected material) may be optionally adjusted to form a portion of the capacitor dielectric layer 513*a* filled up the air gap 504 between each of the columnar bottom electrodes 511 and the second supporting layer 593, and another portion of the capacitor dielectric layer 513*b* may fill up the air gap 506 between each columnar bottom electrode 511 and the first supporting layer 591. In other words, the capacitor dielectric layer 513, 513*a*, 513*b* disposed on two opposite sidewalls of each columnar bottom electrodes 511 have various thicknesses, as shown in FIG. 15. Furthermore, the capacitor dielectric layer 513, 513*a*, 513*b* may also include a high-k dielectric material like hafnium oxide, hafnium silicon oxide, hafnium silicon oxynitride, zinc oxide, titanium oxide or zirconia-alumina-zirconia, and which may further fill in the air gaps 504, 506 between the second supporting layer 593 and each columnar bottom electrode 511, and between the first supporting layer 591 and each columnar bottom electrode 511 to form a more reliable capacitor structure 510 thereby. In another embodiment, the capacitor dielectric layer 513 formed subsequently may optionally not fill in the air gap 504 between each of the columnar bottom electrodes 511 and the second supporting layer 593 and/or the air gap 506 between the first supporting layer 591 and each columnar bottom electrode 511, to remain the air gaps 504, 506 after forming the capacitor dielectric layer 513. Also, in another embodiment, due to the variation of the sacrificial layer 501 as shown in FIG. 13, one of the columnar bottom electrodes 611 may include the recess portion 511*a* extended till the boundary between the first supporting layer 591 and the second supporting layer 593 both on two opposite sidewalls thereof, and/or another one of the columnar bottom electrodes 611 may include the recess portion 511*b* extended till being below the first supporting layer 591 both on two opposite sidewalls thereof, as shown in FIG. 16. Then, the columnar bottom electrodes 611 may therefore present in more diverse asymmetric structures.

Through these arrangements, the fabricating method of the capacitor structure 510/610 is accomplished thereby. The capacitor structure 510/610 includes a plurality of vertically extended capacitors, to serve as the storage nodes of the semiconductor device 500. The storage nodes are allowable to be electrically connected to a transistor (not shown in the drawings) of the semiconductor device 500 through the storage node pads 180 and the storage node contacts (namely the plugs 150), so that, the capacitor structure 510/610 may therefore gain better contact relationship with the storage node contacts disposed on the substrate 110. In this way, the semiconductor device 500 of the present embodiment may also form a dynamic random access memory device.

According to the fabricating method of the third embodiment of the present disclosure, the parameters of the deposition process are adjusted to form the sacrificial layers 501 with various lengths, various thicknesses, or overall uneven films as shown in FIG. 13, so that, the columnar bottom electrodes 511 formed subsequently may therefore obtain more diverse asymmetric structures, to further enlarge the distance between the adjacent columnar bottom electrodes 511/611. Accordingly, the subsequent deposition process of the capacitor dielectric layer 513 and the top electrode layer 515 are smoothly performed. In addition, the columnar bottom electrode 511/611 may be further stably disposed on the supporting structure 590, to improve the structural reliability and the device performances of the semiconductor device 500.

Overall speaking, the fabricating method of the present disclosure firstly utilizes a deposition process with the poor step coverage and an etching process to from sacrificial layers on surfaces of openings disposed within the supporting layer structure, so that, the columnar bottom electrodes formed subsequently may therefore obtain a vertical columnar structure with a narrow top and a wide bottom, to primary enlarge the distance between the columnar bottom electrodes. Following these, a plurality of recesses corners is formed through the mask patterns while partially removing the supporting layer structure, so as to further enlarge the distance between the columnar bottom electrodes for facilitating the subsequent deposition process of the capacitor dielectric layer and the top electrode layer. Thus, the fabricating method of the present disclose enables to effectively improve the structural defect caused by shrinking the density of the memory cells, and the capacitor dielectric layer and the top electrode layer formed subsequently may be further uniformly and plat covered on the columnar bottom electrodes, dramatically improving the structural reliability thereof. Then, the semiconductor device of the present disclosure may therefore gain better functions and performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a substrate;

a plurality of storage node pads, disposed on the substrate;

a supporting structure, disposed on the substrate and comprising a first supporting layer and a second supporting layer from bottom to top, wherein a height between a bottom surface of the first supporting layer and a top surface of the substrate is less than a height between a bottom surface of the second supporting layer and the top surface of the substrate; and a capacitor structure, disposed on the substrate, the capacitor structure comprising a plurality of columnar bottom electrodes, a capacitor dielectric layer and a top electrode layer stacked from bottom to top, wherein each of the columnar bottom electrodes comprise two recess portions extended from second supporting layer to first supporting layer, and the two recess portions are asymmetric to each other.

2. The semiconductor device according to claim 1, wherein one of the two recess portions extends to below the first supporting layer in a direction vertical to the substrate.

3. The semiconductor device according to claim 1, wherein one of the two recess portions has an irregular surface.

4. The semiconductor device according to claim 1, wherein the two recess portions respectively comprise even or uneven recesses.

5. The semiconductor device according to claim 1, wherein the two recess portions comprise different extending lengths in the direction vertical to the substrate.

6. The semiconductor device according to claim 3, wherein the two recess portions respective comprises a recess, and the recesses of the two recess portions have different recess degrees in a direction horizontal to the substrate.

7. The semiconductor device according to claim 1, wherein the capacitor dielectric layer disposed on the two opposite sidewalls has different thicknesses.

8. The semiconductor device according to claim 1, wherein the two recess portions are partially inclined in different degrees in the direction vertical to the substrate.

9. The semiconductor device according to claim 6, wherein the recesses of the two recess portions are in different shapes.

* * * * *